(12) United States Patent
Muhtaroglu et al.

(10) Patent No.: US 7,157,924 B2
(45) Date of Patent: Jan. 2, 2007

(54) METHOD AND APPARATUS FOR ON-DIE VOLTAGE FLUCTUATION DETECTION

(75) Inventors: Ali Muhtaroglu, Hillsboro, OR (US); Kent Callahan, Hillsboro, OR (US); Tawfik Arabi, Tigard, OR (US); Greg F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/683,189

(22) Filed: Oct. 10, 2003

(65) Prior Publication Data

US 2004/0085085 A1 May 6, 2004

Related U.S. Application Data

(63) Continuation of application No. 10/021,055, filed on Dec. 19, 2001, now Pat. No. 6,747,470.

(51) Int. Cl.
*G01R 31/26* (2006.01)
(52) U.S. Cl. .................................................. 324/765
(58) Field of Classification Search ............... 324/765, 324/754, 158.1, 755, 769, 758; 714/719, 714/720, 724; 365/201; 438/14, 17, 18; 327/530, 531, 58, 62, 74, 79
See application file for complete search history.

(56) References Cited

U.S. PATENT DOCUMENTS

| | | | | |
|---|---|---|---|---|
| 5,047,667 A * | 9/1991 | Howie | ......................... | 327/58 |
| 5,050,190 A * | 9/1991 | Shimada et al. | ............ | 375/317 |
| 5,706,222 A * | 1/1998 | Bonaccio et al. | ........... | 708/841 |
| 5,825,777 A * | 10/1998 | Komarek et al. | ........... | 370/458 |
| 6,000,829 A * | 12/1999 | Kurokawa et al. | ............ | 700/95 |
| 6,107,840 A * | 8/2000 | Cameron et al. | ............. | 327/62 |
| 6,138,255 A | 10/2000 | Noji | | |
| 6,201,448 B1 | 3/2001 | Tam et al. | | |
| 6,204,699 B1 * | 3/2001 | Shimazaki | ................... | 327/72 |
| 6,208,169 B1 | 3/2001 | Wong et al. | | |
| 6,232,802 B1 * | 5/2001 | Chang et al. | ................. | 327/59 |
| 6,266,288 B1 | 7/2001 | Borkar | | |
| 6,384,640 B1 * | 5/2002 | Du Bois et al. | .............. | 327/90 |
| 6,407,571 B1 * | 6/2002 | Furuya et al. | .............. | 324/765 |
| 6,437,833 B1 * | 8/2002 | Tagomori et al. | ........... | 348/657 |
| 6,747,470 B1 * | 6/2004 | Muhtaroglu et al. | ........ | 324/765 |
| 6,847,222 B1 * | 1/2005 | Muraya et al. | ............. | 324/765 |

* cited by examiner

*Primary Examiner*—Jermele Hollington
(74) *Attorney, Agent, or Firm*—Blakely, Sokoloff, Taylor & Zafman LLP

(57) ABSTRACT

An on-die device is provided to measure/detect voltage fluctuations. This may include a control unit to generate differential reference signals (such as differential current signals), a first detector unit and a second detector unit. The differential reference signals may be generated based on a Vcc reference signal and a Vss reference signal. The first detector unit may receive the differential reference signals from the control unit and may receive first voltage signals (also called monitored signals) from a first device under test (DUT) located on the die or from a first area on the die. The first detector unit may provide (or output) a first signal indicative of a voltage fluctuation (voltage droop or overshoot) of the first voltage signals. The second detector unit may receive the differential reference signals from the control unit and may receive second voltage signals (also called monitored signals) from a second device under test (DUT) located on the die. The second detector unit may provide (or output) a second signal indicative of a voltage fluctuation (or voltage droop) of the second voltage signals.

30 Claims, 8 Drawing Sheets

METHOD AND APPARATUS FOR ON-DIE VOLTAGE FLUCTUATION DETECTION

This application is a continuation of Ser. No. 10/021,055, filed on Dec. 19, 2001 now U.S. Pat. No. 6,747,470.

FIELD

The present invention is directed to supply voltage fluctuation (droop and overshoot) detection. More particularly, the present invention is directed to a method and apparatus for detecting on-die voltage fluctuations.

BACKGROUND

On-die voltage fluctuation (such as voltage droop and/or voltage overshoot) of a power supply is directly related to the performance of a silicon die. As such, Vcc droop measurements may be an integral part of power delivery validation and speed path debug for an entire network from the Vcc regulator on a motherboard to local circuit supplies internal to the die. Low frequency Vcc fluctuations may be monitored by scope measurement on debug pins. That is, a predetermined number of debug pins may be reserved for monitoring Vcc fluctuations on the die. However, one problem is the limited number of debug pins. Another problem is package attenuation, which makes it difficult to observe medium to high frequency droops on the die. High frequency droop measurements across the die may be performed using pico-probing techniques to avoid package attenuation. However, this may require a special pico-probing station, a high bandwidth oscilloscope, successful establishing contact to metal layers on a silicon die, and a lot of effort. An upper limit on the number of post-silicon edits per die may be quickly reached because of the imperfect success rate. The amount and type of data collection may be limited, and thus may not be incorporated into a high volume manufacturing flow.

On-die circuit techniques may have one or more of the following problems. First, the on-die circuit techniques may not be as immune to the surrounding noise. That is, the techniques may require DC-like environments in order to operate correctly. Second, the techniques may be very limited in signal frequency, amplitude or resolution that can be detected. Third, the techniques may require the detected signals to be periodic. Fourth, the modules may not be compact enough or have special analog reference requirements that make them unsuitable for distributed placement on integrated circuits. Fourth, the techniques may need special test equipment setup due to analog inputs/outputs or post-processing requirements.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
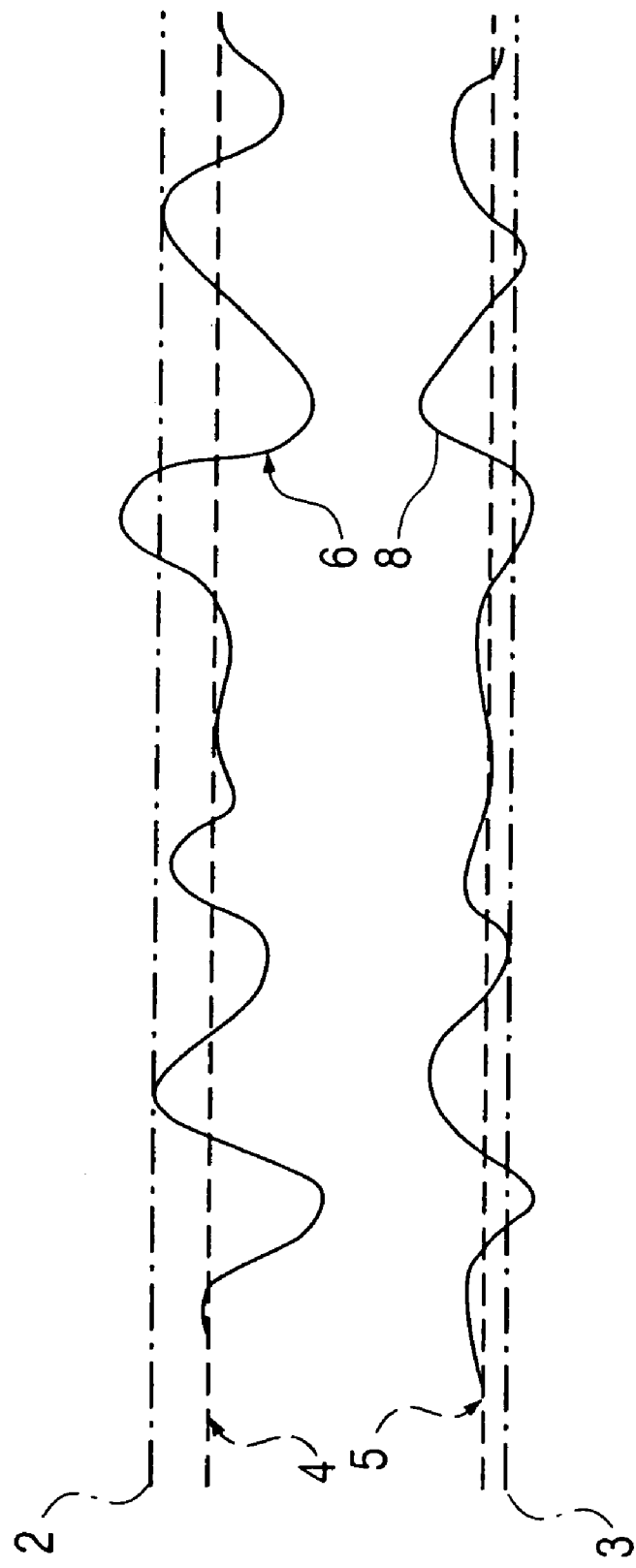
FIG. 1 illustrates Vcc/Vss voltage fluctuation.

In the following detailed description, like reference numerals and characters may be used to designate identical, corresponding or similar components in differing figure drawings. While the present invention will be described with respect to example circuits, the implementation of these circuits may be accomplished in any one of several ways, including but not limited to logic circuits, circuit elements provided within a microchip or integrated circuit as well as software implementation of the respective functions. Each of these implementations is within the scope of the present invention. The circuit design(s) may have many variations of the circuit components that can perform the various functions. Each of these variations are within the scope of the present invention.

Embodiments of the present invention may also be described with respect to signals being input or output from different circuit components. It is understood that while the discussion identifies a signal, the signal may be transmitted over a signal line or similar type of mechanism. Further, the terminology signal may also correspond to a signal line as shown in the drawings. Additionally, well-known power/ground and address connections to components may not be shown within the figures for simplicity of illustration and discussion, and so as not to obscure the invention. The timing drawings may not be drawn to scale but rather exemplary values may be mentioned when appropriate. With regard to the description of any timing signals, the terms HIGH and LOW may be used in a generic sense. More particularly, such terms may be used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a change in logic.

Further, arrangements may be shown in block diagram form in order to avoid obscuring the invention, and also in view of the fact that specifics with respect to implementation of such block diagram arrangements are highly dependent upon the platform within which the present invention is to be implemented. That is, such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details. Finally, it should be apparent that differing combinations of hard-wired circuitry may be used to implement embodiments of the present invention. That is, the present invention is not limited to any specific combination of hardware.

Embodiments of the present invention may be described with respect to an on-die device that includes a control unit to generate differential reference signals (such as differential current signals), a first detector unit and a second detector unit. The differential reference signals may be generated based on a Vcc reference signal and a Vss reference signal. The first detector unit may receive the differential reference signals from the control unit and may receive first voltage signals (also called monitored signals) from a first device (or area) under test (DUT) located on the die. The first detector unit may provide (or output) a first signal indicative of a differential voltage fluctuation (such as voltage droop or voltage overshoot) of the first voltage signals. The second detector unit may receive the differential reference signals from the control unit and may receive second voltage signals (also called monitored signals) from a second device (or area) under test (DUT) located on the die. The second detector unit may provide (or output) a second signal indicative of a differential voltage fluctuation (such as voltage droop or voltage overshoot) of the second voltage signals.

FIG. 1 illustrates Vcc/Vss voltage fluctuation. More specifically, FIG. 1 shows a set Vcc level 2 and a set Vss level 3. These may be considered the ideal Vcc and Vss levels. FIG. 1 also shows an observed DC Vcc level 4 and an observed DC Vss level 5 as well as an observed AC Vcc level 6 and an observed AC Vss level 8. The observed DC and AC levels may correspond to monitored DC and AC voltages across a component located on a silicon die. As may be clearly seen, the observed levels may vary from the set Vcc level 2 and the set Vss level 3. The performance of the circuitry powered by the Vcc/Vss signals may not degrade if impacted by common mode noise in the first half of FIG. 1, but may degrade if the polarity of the noise is different on Vcc and Vss as depicted in the second half of FIG. 1. Therefore, the on-die device to be described below may be designed to detect differential (Vcc–Vss) fluctuations.

Figure 2:
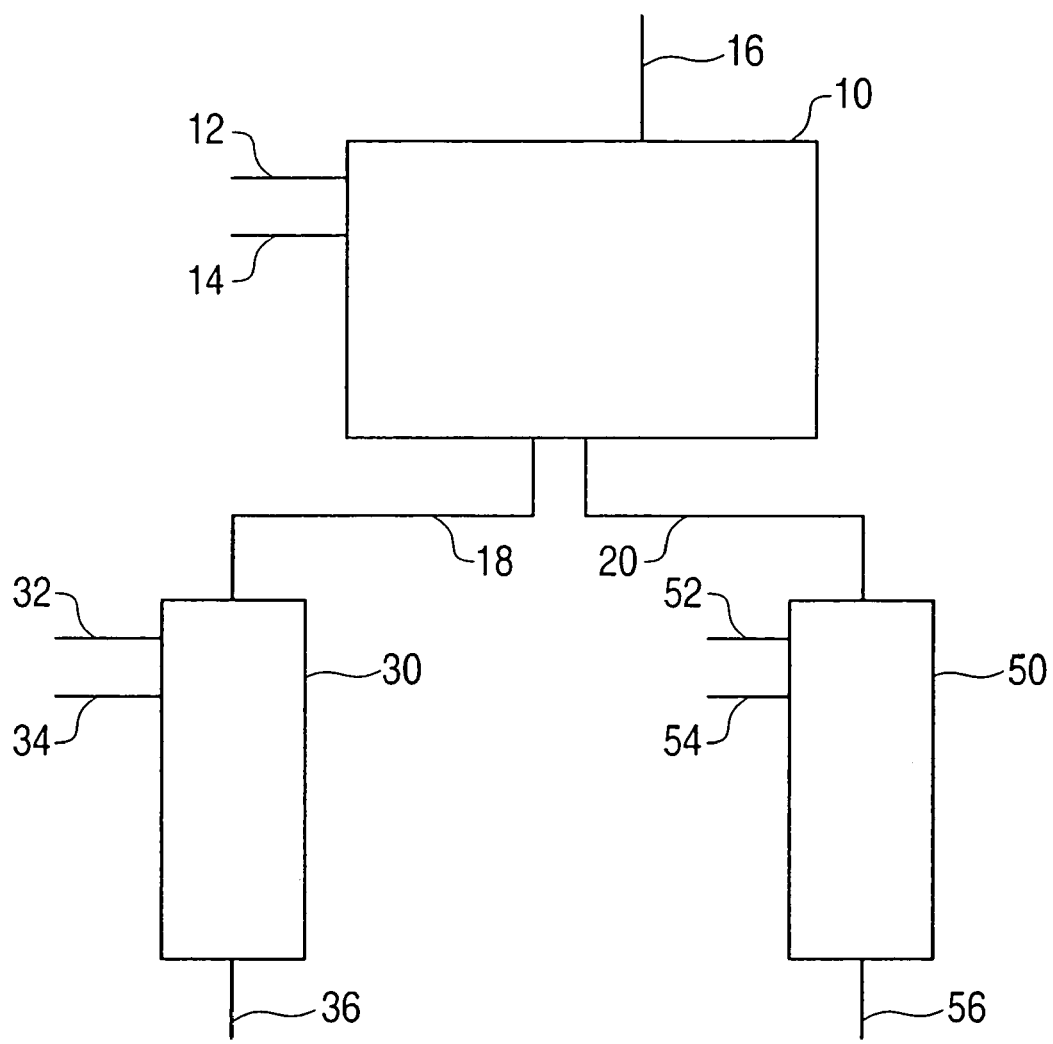
FIG. 2 is a block diagram of an on-die device to detect/measure voltage fluctuations according to an example embodiment of the present invention.

FIG. 2 illustrates an on-die device to measure or detect voltage fluctuations (such as droop and/or overshoot) according to an example embodiment of the present invention. Other embodiments and configurations are also within the scope of the present invention. More specifically, FIG. 2 illustrates a control unit 10, a first detector unit 30 and a second detector unit 50. Embodiments of the present invention are also applicable to more detector units than that shown in FIG. 2 and to a lesser number of detector units than that shown in FIG. 2.

The control unit 10 includes a Vcc reference signal line 12 to receive a Vcc reference signal and a Vss reference signal line 14 to receive a Vss reference signal. The Vss reference signal and the Vcc reference signal may be received from a source external to the silicon die. That is, the Vcc signal and the Vss signal may be separately supplied to a very large-scale integrated circuit (VLSI) die in any of a number of well-known ways. For example, a Vcc signal and a Vss signal may be supplied to mixed signal circuits. The reference signals Vcc and Vss may also be internally generated, for example, using a bandgap circuit. The control unit 10 further includes input/output signal lines 16 to input and output data from the die such as through the use of pins (e.g., JTAG pins or a test access port (TAP)). That is, the control unit 10 may include a digital interface. The digital control may be scanned in through the TAP and results may be scanned out through the TAP at the end of a pattern run or during regular operation.

The control unit 10 may produce differential current signals on differential reference signal lines 18 and 20. The pair of differential reference signal lines 18 may correspond to two signal lines that may carry differential current signals. Likewise, the pair of differential reference signal lines 20 may correspond to two signal lines that may carry differential current signals. The pair of differential reference signal lines 18 thereby carries similar signals as the pair of differential reference signal lines 20. Each of the pair of differential reference signal lines 18 and 20 may be matched interconnects that couple the control unit 10 and each of the respective detector units (including the first detector unit 30 and the second detector unit 50). Current signals may be used rather than voltage signals since the current signals may be more immune to noise coupling, DC offset, and ground variations.

The first detector unit 30 may include a Vcc monitored signal line 32 and a Vss monitored signal line 34. The Vcc monitored signal line 32 may receive a monitored Vcc signal from a first device under test (or first component) that is located on the die. Similarly, the Vss monitored signal line 34 may receive a Vss signal from the first device under test. The monitored signal lines 32 and 34 may be used to detect/measure the differential voltage fluctuation (such as voltage droop or voltage fluctuation) of the first device under test. The first detector unit 30 may receive the differential current signals on each of the pair of the differential reference signal lines 18, the Vcc monitored signal line 32 and the Vss monitored signal line 34 and provide an output signal on a signal line 36 indicative of the differential voltage fluctuation. The output signal may indicate a change in state if the voltage fluctuations exceed the reference voltages set by the differential current signals.

The second detector unit 50 may include a Vcc monitored signal line 52 and a Vss monitored signal line 54. The Vcc monitored signal line 52 may receive a monitored Vcc signal from a second device under test (or second component) that is located on the die. Similarly, the Vss monitored signal line 54 may receive a Vss signal from the second device under test. The monitored signal lines 52 and 54 may be used to detect/measure the differential voltage fluctuation (such as voltage droop or voltage fluctuation) of the second device under test. The second detector unit 50 may receive the differential current signals on each of the pair of differential reference signal lines 20, the Vcc monitored signal line 52 and the Vss monitored signal line 54 and provide an output signal on a signal line 56 indicative of the differential voltage fluctuation. The output signal may indicate a change in state if the voltage fluctuations exceed the reference voltages set by the differential current signals.

As may be determined from the above embodiments and the embodiments to follow, a pair of differential current reference lines with minimum spacing may be routed from a control unit located on-die to different die locations for voltage droop detection. The pair of differential current reference lines may be utilized for differential (Vcc–Vss) measurements. Disadvantageous arrangement having single ended references may not be tolerant to coupling noise injected from surrounding noise sources such as clock signals, and to DC offsets.

Embodiments of the present invention may provide a threshold based detection mechanism. Each detector unit may report a binary output to indicate if a programmed analog voltage level is exceeded by the monitored differential fluctuations. That is, the differential AC (noise) signal may be compared to a digitally preset threshold voltage with high accuracy even when the device under test process induced variation is wide, and produces a digital output. The process dependent inaccuracies in the set threshold voltage may be calibrated using the same digital I/O when the device under test is quiet (e.g., deepsleep).

Additionally, the DC bias of the differentially detected (Vcc−Vss) signals may be shifted to approximately Vcc/2 such that the comparator performs better. The on-die device may provide an accurate and fast (Vcc−Vss) differential droop detection range of 0 to approximately ($Vcc_{DC}$−$Vss_{DC}$), which covers a worst-case scenario of power delivery events that may be of interest.

Digital post-processing capability may be provided for time-domain analysis that is compatible with standard TAP interfaces, and therefore may not require additional pins. This capability may allow identifying differential droops larger than a predetermined value that occur between a core clock cycle C1 and a core clock cycle C2, and lasts for a number of core clock cycles (or less than one core clock cycle in an instantaneous mode of operation). Information may be collected with multiple TAP commands to build a time domain profile of the voltage fluctuation and correlate against functional or timing (speedpath) failures.

Still further, the layout area may be opportunistically utilized to locate on-die droop detectors (also called detector units) in different die locations in order to get valuable droop information across different pattern sets. This may provide a good understanding of on-die power delivery performance in response to di/dt events and proactively improve power delivery design. This may be useful for speed path debug. This may also be useful in high volume manufacturing to allow incorporation of special screens in the event that speed paths are discovered that are not in the test suite. This may still further potentially react to high di/dt's with other on-die power delivery features.

Figure 3:
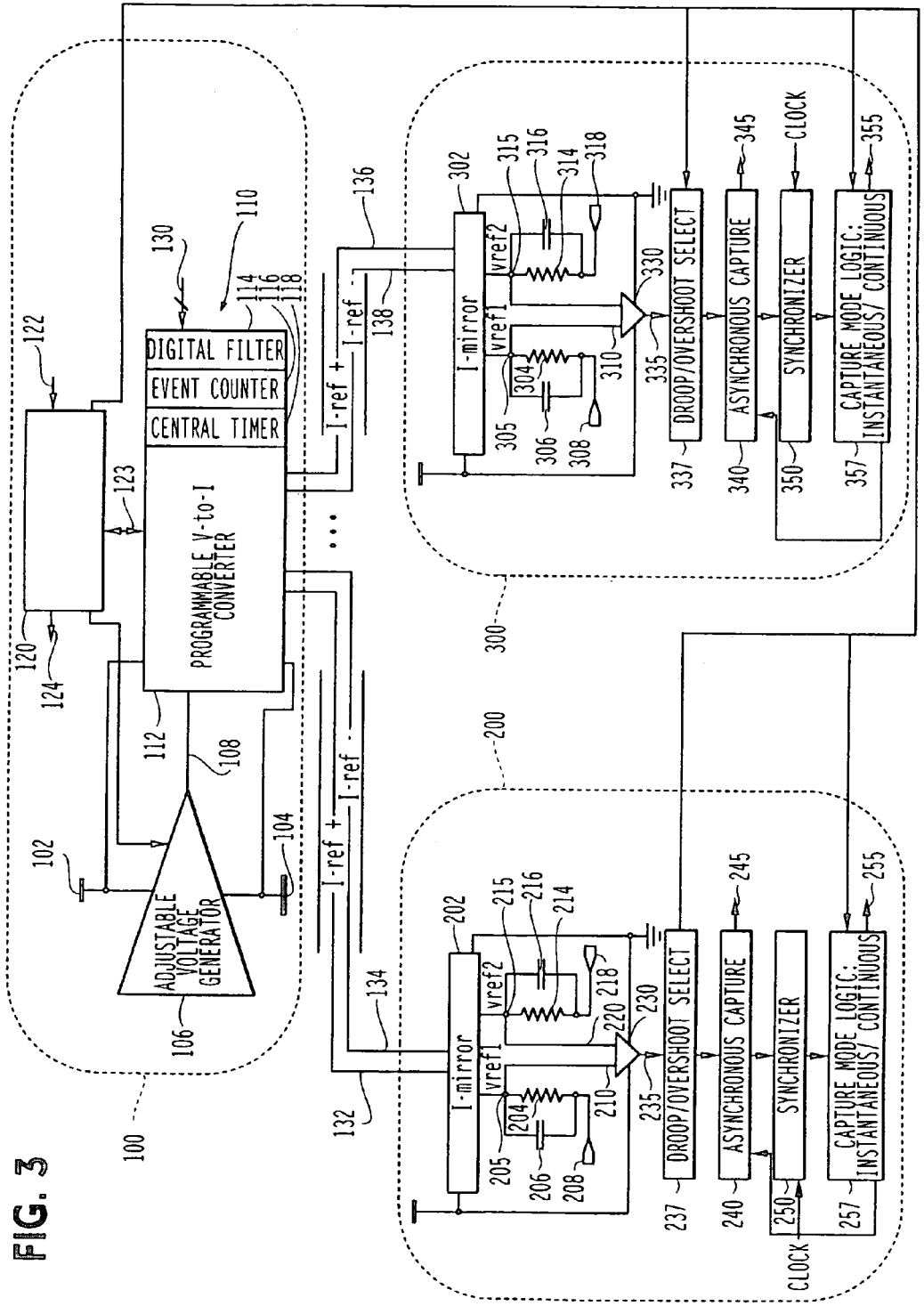
FIG. 3 is a diagram of an on-die device to detect/measure voltage fluctuations according to an example embodiment of the present invention.

FIG. 3 illustrates a diagram of an on-die device to detect/measure voltage fluctuations for an on-die component according to an example embodiment of the present invention. Other embodiments and configurations are also within the scope of the present invention. More specifically, FIG. 3 illustrates a control unit 100, a first detector unit 200 and a second detector unit 300. The control unit 100 may correspond to the control unit 10 (FIG. 3), the first detector unit 200 may correspond to the first detector unit 30 (FIG. 3) and the second detector unit 300 may correspond to the second detector unit 50 (FIG. 3).

The control unit 100 may include an adjustable voltage generator 106, a logic block 110 and an input mechanism 120. A Vcc reference signal may be input to the control unit 100 along a signal line 102 and a Vss reference signal may be input to the control unit 100 along a Vss reference signal line 104. The Vcc reference signal and the Vss reference signal may be provided by a source external or internal to the silicon die and thus are different than the voltages being monitored. The signals may is be input to the adjustable voltage generator 106 that may thereby output a reference voltage signal (vbias) along a signal line 108 to the logic block 110. The logic block 110 may include a programmable voltage-to-current converter 112. The programmable voltage-to-current converter 112 may also receive inputs from the input mechanism 120 along signal lines 123. That is, the input mechanism 120 may receive signals along an input signal line 122 and provide signals to the programmable voltage-to-current converter 112 along the signal lines 123. The input signals may represent an acceptable amount of voltage fluctuation (or offset) that the device will tolerate prior to providing an indication of voltage fluctuation. The programmable voltage-to-current converter 112 may receive signals from the input mechanism 120 and the vbias signal and appropriately provide differential current signals as output signals to each of the detector units (including the first detector unit 200 and the second detector unit 300). For example, the differential current signals may be an Iref+ signal output along a signal line 132 and an Iref− signal output along a signal line 134. The Iref+/Iref− signals on the signal lines 132 and 134 may be input to the first detector unit 200. Similarly, the differential current signals may be an Iref+ signal output along a signal line 136 and an Iref− signal output along a signal line 138. The Iref+/Iref− signals on the signal lines 136 and 138 may be input to the second detector unit 300. These signals may include the offset entered through the TAP interface, for example.

The first detector unit 200 receives the differential current signals (Iref+ and Iref−) along the signal lines 132 and 134. The differential signals may be input to a current mirror 202 that isolates circuitry from noise of the signal lines 132 and 134. A vref1 signal may be provided at a node 205 and a vref2 signal may be provided at a node 215. The vref1 and vref2 signals are input along signal lines 210 and 220, respectively, to an analog comparator 230 that provides a digital signal (i.e., an indicator signal) indicative of the voltage fluctuation. The first detector unit 200 additionally receives a monitored Vss signal for a first device under test along a monitored Vss input signal line 208 and receives a monitored Vcc signal for the first device under test along a monitored Vcc input signal line 218. However, the comparator 230 may be powered by a Vss/Vcc power source that is the same supply as that being monitored for the device under test. In order to avoid problems caused by powering the comparator 230 with the same voltages that are being monitored on the signal lines 208 and 218, the vref1 and vref2 signals may be pulled down to a mid-voltage level or mid-rail level. To accomplish this, the current supply by the mirror may be drawn across the resistors 204 and 214, providing DC voltage shifts between 208 and 205 and between 218 and 215. Varying this current adjusts the offset. The capacitors 206 and 216 ensure that high frequency signals aren't attenuated. The comparator 230 may provide a digital output signal on a signal line 235. This digital output signal may be indicative of whether the vref1 signal is greater than the vref2 signal, or vice versa. For example, the comparator 230 may output a HIGH signal if the vref2 signal on the signal line 220 is greater than the vref1 signal on the signal line 210. Likewise, the comparator 230 may output a LOW signal if the vref1 voltage on the signal line 210 is greater than the vref2 signal on the signal line 220. This digital output signal on the signal line 235 may be indicative of the differential voltage fluctuation (voltage droop or overshoot) of the monitored signals (that are input along the monitored Vss input signal line 208 and the monitored Vcc input signal 218).

The digital output signal may be utilized in any one of a several different manners. A signal may be provided from the control unit 100 to a droop/overshoot select unit 237 to select either voltage droop or voltage overshoot for detection. The digital output signal may then be captured by an asynchronous capture block 240. The asynchronous capture block 240 may output a signal (or signals) along a signal line 245 without regard to the core clock signal. That is, a signal may be sent independent of the core clock. This signal may be called an asynchronous detect indicator. The asynchronous capture block 240 may provide the output signal back to the control unit 100 indicating a change in the state of the signal on the signal line 235. A change in the state may be evidenced by a HIGH signal turning to a LOW signal. As another example, the digital output signal may be captured by a synchronizer capture block 250. The synchronizer capture block 250 may output a signal (or signals) to capture mode logic unit 257 based on the clock signal. The capture mode logic unit 257 may receive signals from the control unit 100 indicating the mode of operation such as instantaneous or continuous as will be described below. The capture mode logic 257 may provide a signal (or signals) along a signal line 255 back to the control unit 100 indicating a change in the state of the signal on the signal line 235. This signal may be called a synchronous detect indicator. The asynchronous capture block 240 may correspond to a S/R type of latch, for example, to store and maintain data regarding the state of the respectively received signals. The synchronous capture block 250 may correspond to a D-type of latch, for example, triggered by the clock used for high speed post processing. Other mechanisms for capturing this data and forwarding data to the control unit 100 are also within the scope of the present invention. As another example, the data may also be output from the comparator 230 to a device external to the die to perform post-processing activities.

The second detector unit 300 may operate in a similar manner as the first detector unit 200 but with respect to a second device under test located on the die. More specifically, the second detector unit 300 may receive the differential current signals (Iref+ and Iref−) along the signal lines 136 and 138. The differential signals may be input to a current mirror 302 that isolates circuitry from noise on the signal lines 136 and 138. A vref1 signal may be provided at a node 305 and a vref2 signal may be provided at a node 315. The vref1 and vref2 signals will be input along signal lines 310 and 320, respectively, to an analog comparator 330 that provides a digital signal (i.e., an indicator signal) indicative of the voltage fluctuation. The second detector unit 300 additionally receives a monitored Vss signal for a second device under test along a monitored Vss input signal line 308 and receives a monitored Vcc signal for the second device under test along a monitored Vcc input signal line 318. However, the comparator 330 may also be powered by a Vss/Vcc power source that is the same supply as that being monitored for the second device under test. In order to avoid problems caused by powering the comparator 330 with the same voltages that are being monitored on the signal lines 308 and 318, the vref1 and vref2 signals may be pulled down to a mid-voltage level or mid-rail level. To accomplish this, the current supply by the mirror may be drawn across the resistors 304 and 314, providing DC voltage shifts between 308 and 305 and between 318 and 315. Varying this current adjusts the offset. The capacitors 306 and 316 ensure that high frequency signals aren't attenuated. The comparator 330 may provide a digital output signal on a signal line 335. This digital output signal may be indicative of whether the vref1 signal is greater than the vref2 signal or vice versa. For example, the comparator 330 may output a HIGH signal if the vref2 signal on the signal line 320 is greater than the vref1 signal on the signal line 310. Likewise, the comparator 330 may output a LOW signal if the vref1 voltage on the signal line 310 is greater than the vref2 signal on the signal line 320. This digital output signal on the signal line 335 may be indicative of the differential voltage fluctuation (voltage droop or overshoot) of the monitored signals (that are input along the monitored Vss input signal line 308 and the monitored Vcc input signal 318).

The digital output signal on the signal line 335 may be utilized in anyone of a several different manners as discussed above with respect to the first detector unit 200. A signal may be provided from the control unit 100 to a droop/overshoot select unit 337 to select either voltage droop or overshoot for detection. The digital output signal may then be captured by an asynchronous capture block 340. The asynchronous capture block 340 may output a signal (or signals) along a signal line 345 without regard to the clock signal. This signal may be called the asynchronous detect indicator. The asynchronous capture block 340 may provide the output signal back to the control unit 100 indicating a change in the state of the signal on the signal line 345. As another example, the digital output signal may be captured by a synchronizer capture block 350. The synchronous capture block 350 may output a signal (or signals) to capture mode logic unit 357 based on the clock signal. The capture mode logic unit 357 may receive signals from the control unit 100 indicating the mode of operation such as instantaneous or continuous as will be described below. The capture mode logic 357 may provide a signal (or signals) along a signal line 355 back to the control unit 100 indicating a change in the state of the signal on the signal line 335. This signal may be called asynchronous detect indicator. The asynchronous capture block 340 may correspond to a S/R type of latch, for example, to store and maintain data regarding the state of the respectively received signals. The synchronous capture block 350 may correspond to a D-type of latch, for example, triggered by the clock used for high speed post processing.

The control unit 100 may receive signals output along the signal lines 245, 255, 345 and 355. These signals may be input to the logic block 110 along the signal lines 130. The logic block 110 may include several mechanisms beside the programmable voltage-to-current converter 112 including, but not limited to, a digital filter mechanism 114, an event counter mechanism 116 and a timer mechanism 118. These mechanisms may perform various post-processing activities including analysis and computations on the input data indicating when the respective voltage fluctuations have occurred and/or when changes in the state of signals have occurred. A digital timer and filtering mechanism (such as a circuit) may enable time domain analysis at the sampling rate of the core clock. A time-continuous droop measurement may be made at this sampling rate by running the same pattern many times with different timer and threshold settings. The data may be sent to the input mechanism 120 and output along the signal lines 124 to a device external to the die. Alternatively, data along the signal lines 245, 255, 345 and 355 may be output directly to a device external to the die. Software or hardware located external to the die may thereby perform the post-processing activities.

Figure 4:
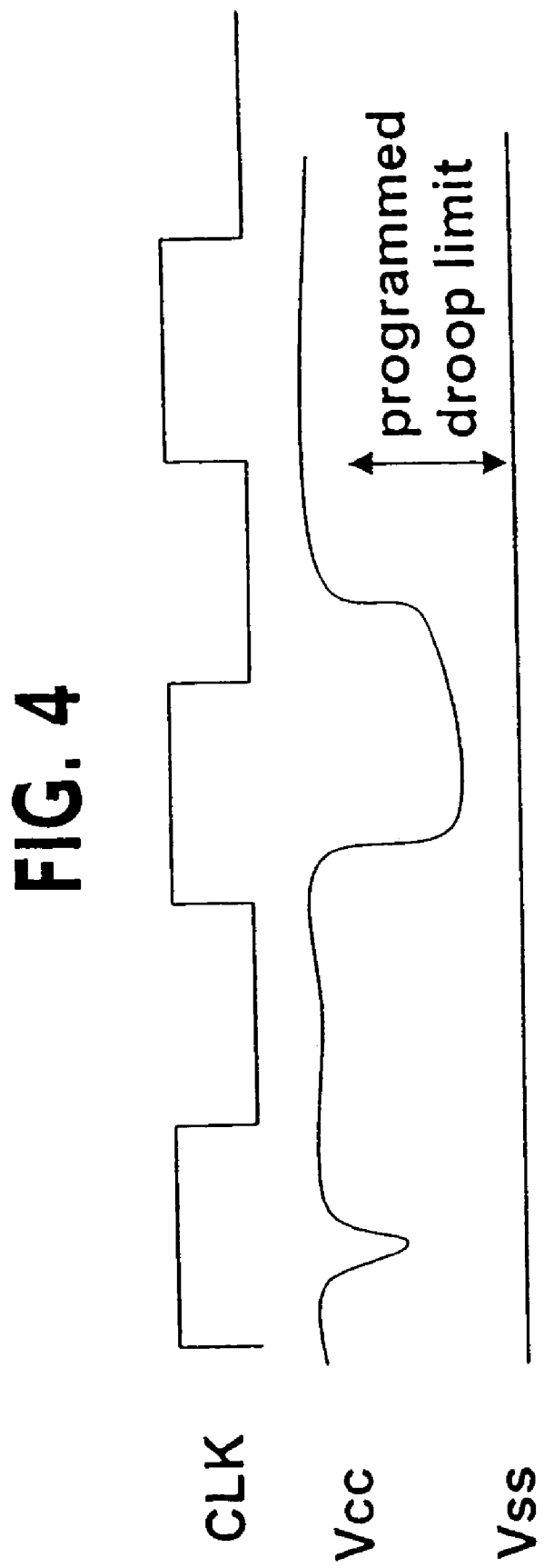
FIG. 4 is a timing diagram showing an instantaneous detection of voltage fluctuation according to an example embodiment of the present invention.
Figure 5:
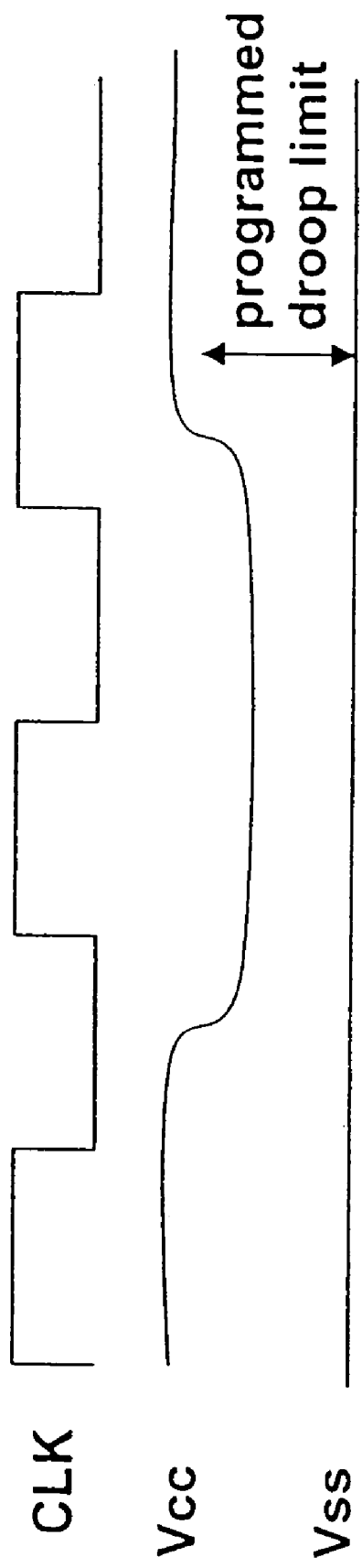
FIG. 5 is a timing diagram showing a continuous detection of voltage fluctuation according to an example embodiment of the present invention.
Figure 6:
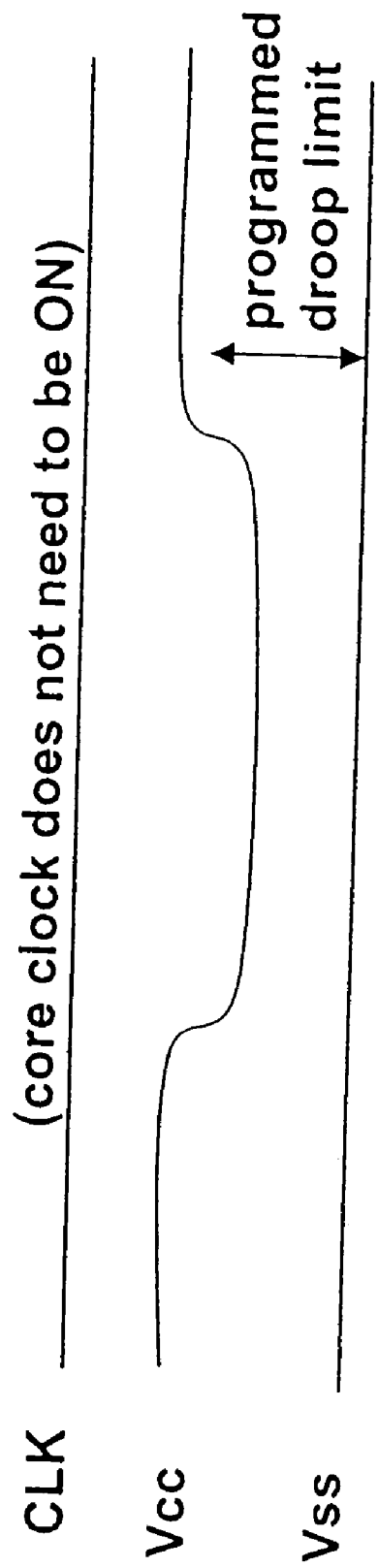
FIG. 6 is a timing diagram, showing a sticky instantaneous detection of voltage fluctuation according to an example embodiment of the present invention.

FIGS. 4–6 are timing diagrams showing different detections of the on-die device. These detections may be observed in the post-processing activity, either on-die or off-die. Other types of detections are also within the scope of the present invention. More specifically, FIG. 4 shows an instantaneous detection in which any droop observed beyond a programmed value independent of its duration may be considered an event. In the FIG. 4 example, a droop counter may indicate two droops beyond the programmed droop limit. FIG. 5 shows a continuous detection that counts any droop beyond a programmed value that lasts for at least a predetermined number of clock periods. In the FIG. 5 example, the droop counter may indicate one droop (that lasts for at least one clock cycle). FIG. 6 shows a sticky instantaneous detection in which any droop beyond a programmed value observed after the device reset gets recorded and sticks until the next device reset.

Figure 7:
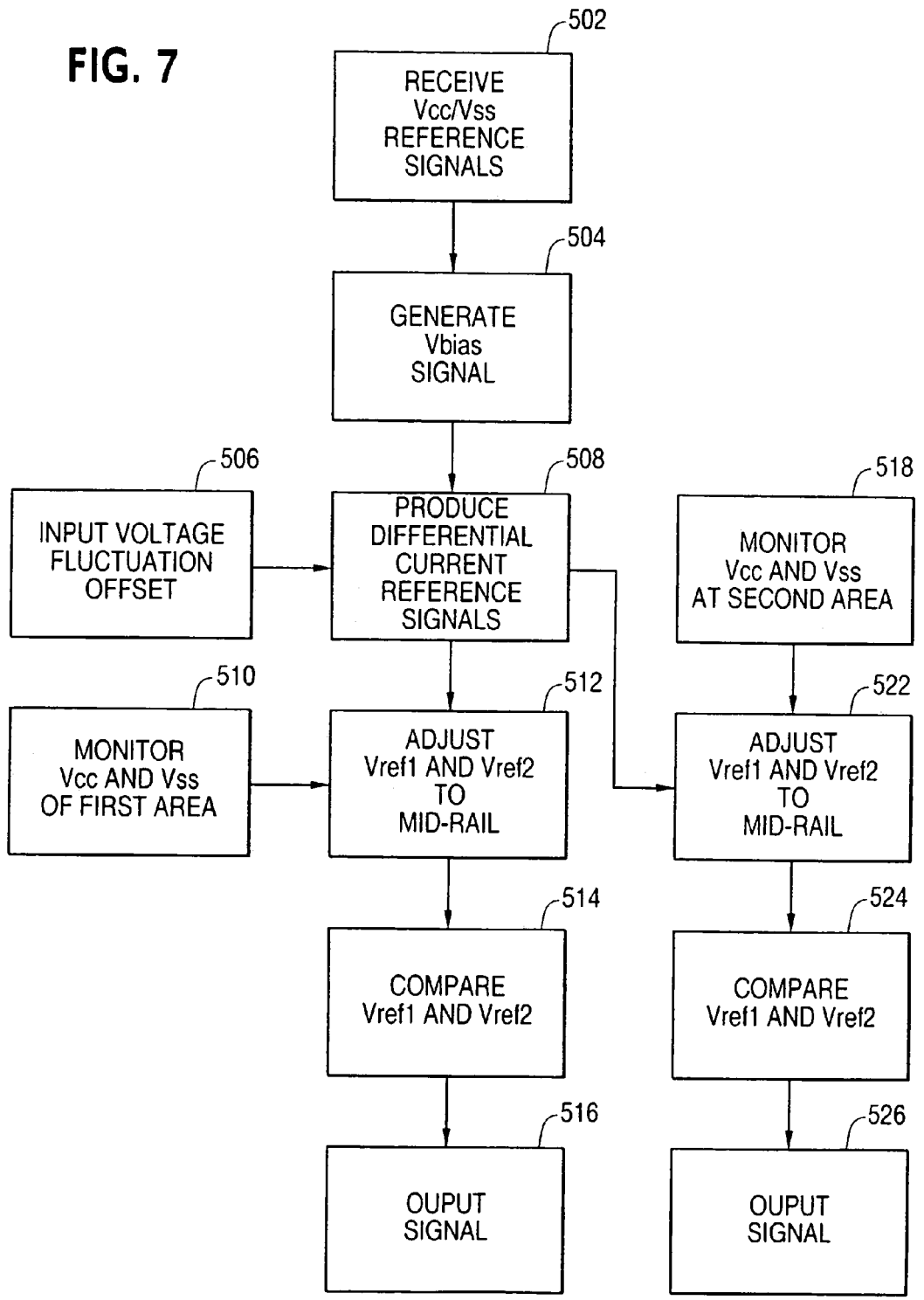
FIG. 7 is a flow chart showing operations of a method to detect/measure voltage fluctuations according to an example embodiment of the present invention.

FIG. 7 illustrates a flow chart 500 showing operations according to an example embodiment of the present invention. Other operations, orders of operations and embodiments are also within the scope of the present invention. More specifically, FIG. 7 illustrates receiving the Vcc/Vss reference signals in block 502. Based on these signals, the DC voltage reference (vbias) signal may be generated in block 504. An acceptable voltage fluctuation (such as droop or overshoot) offset may be input in block 506. One skilled in the art would understand that block 506 may occur at other times including prior to the operations of block 502. In block 508, the differential reference current signals may be produced and provided to each of the detector units. In block 510, the Vcc and Vss signals may be monitored for a first component. In block 512, these signals may be adjusted to a mid-voltage level for better utilization of the comparator. The vref1 and vref2 voltage signals may be compared in block 514 and a signal may be output in block 516 indicative of the differential voltage fluctuation of the monitored signals. Similarly, in block 518, the Vcc and Vss signals may be monitored for a second component. In block 522, these signals may be adjusted to a mid-voltage level for better utilization of the comparator. The vref1 and vref2 voltage signals may be compared in block 524 and a signal may be output in block 526 indicative of the differential voltage fluctuation.

Embodiments of the present invention may measure a magnitude of Vcc/Vss droops (or overshoots) within a frequency spectrum ranging from DC (such as IR drops) to the maximum core clock frequency. This may provide design validation of in-die power delivery. Embodiments may measure the largest droop recorded during a particular run. Depending on how long this droop lasts, the droop may not be observed at the other parts of the die. Further, very high frequency droops will be attenuated through inherent RLC filters across the die. Therefore, the measurement may provide feedback on the local coupling performance. The droop detector location may be relevant to the measurement.

Embodiments of the present invention may also measure the largest Vcc/Vss droop that lasts for one to several clock periods. This type of droop may be observed at the neighboring circuits, and possibly across the whole die. Depending on the whereabouts of the measurement point, it may be possible to observe a degraded version of this droop. Thus, although the droop detector location does not have to be exact, the placement may be picked to be in the neighborhood of such an event.

Embodiments of the present invention may further make the IR droop at the measured location as compared to the expected droop. This measurement may be useful in validating the DC power delivery design parameters.

Embodiments of the present invention have been described with respect to a control unit (such as the control unit 10 or 100) that may utilize a pair of separate (quiet) power supplies to generate a differential reference for the droop detector devices (such as the first detector unit 200 and the second detector unit 300). The quiet power supplies may minimize the impact of core noise to the centrally generated droop reference signal, and hence to the overall accuracy. The voltage reference supplies may be routed from a pair of processor pins, or may be extracted from already available separate analog quiet power supplies on the die, such as those utilized for mixed signal circuits.

A single control voltage reference (such as the vbias signal on the signal line 108) may be generated from the clean power supplies. This single control voltage reference signal may be input to conversion circuitry (such as the programmable voltage-to-current converter 112) that generates a differential (+ & −) current reference to be routed to each droop detector unit on the die. Calibration circuitry may be included as part of the voltage generator so that it can be adjusted to compensate for any layout and process mismatches under quiet conditions when the processor is not active. A usage model may be developed outlining how this calibration may be done through a digital TAP interface taking advantage of an asynchronous low-frequency trip indicator from the droop detectors.

The magnitude of the differential current reference (such as Iref+ and Iref−) may also be varied in discrete steps through the TAP interface using a circuit that changes a threshold against which voltage fluctuations may be detected.

Additional processing logic may reside in the control unit in order to apply programmable digital filtering and time stamping to the droop indicators coming from the detector units.

The control unit may include a TAP controlled digital interface used for scanning in user inputs, and scanning out processed outputs while the remainder of the chip may resume normal operation in parallel.

Figure 8:
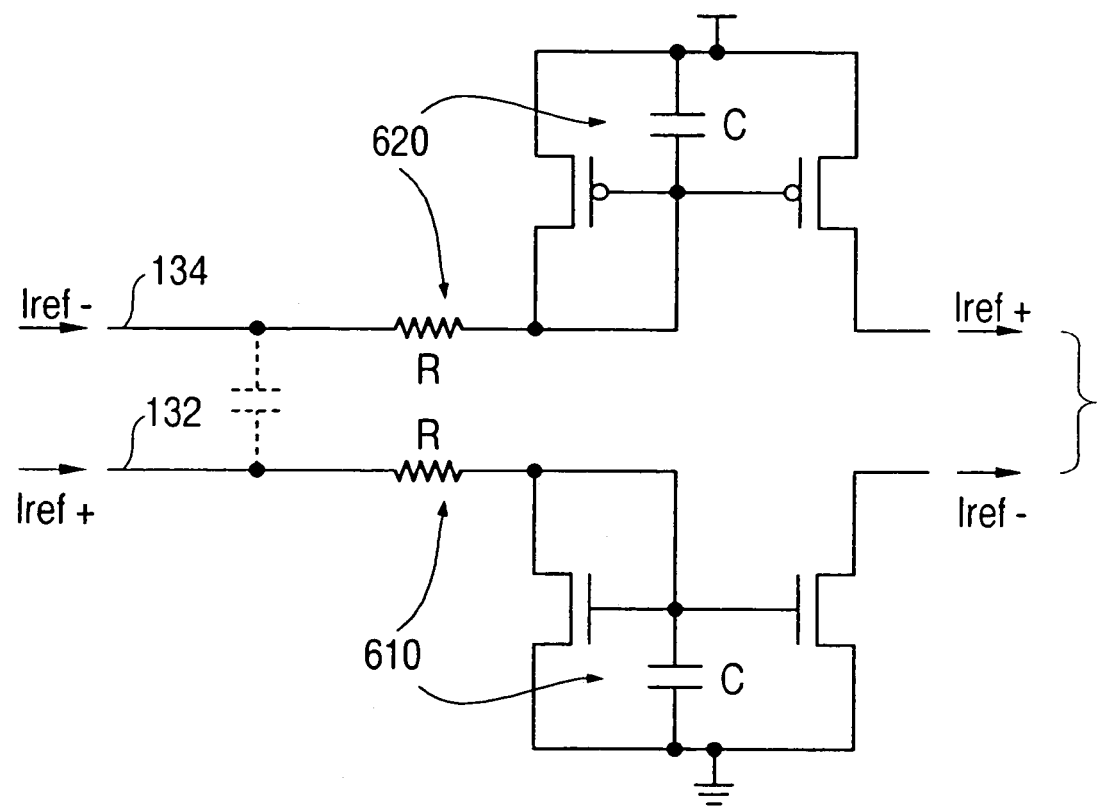
FIG. 8 is a diagram of a current mirror for use in accordance with an embodiment of the present invention.

The detector units (such as the first detector unit 200 or the second detector unit 300) may include that the differential current received by a local unit is forwarded through a current mirror to act as a reference to the droop sensor. The current mirror may provide isolation of the differentially sensed nodes from any capacitive load associated with the routing of the Iref signals. For example, FIG. 8 illustrates a circuit diagram of a current mirror for use in accordance with an embodiment of the present invention. Other arrangements are also possible. For ease of illustration, FIG. 8 will be shown and described with respect to the current mirror 202 shown in FIG. 3. The high frequency coupling to the reference pair may be eliminated by a low-pass filter 610 and a low pass filter 620. Strong inherent coupling (due to routing with minimum pitch) in the reference pair may ensure that any low frequency voltage coupling to one reference may affect the other reference the same way. As a result, any impact from the noise coupling on reference lines becomes common mode to the reference nodes vfef1 and vref2, and therefore does not affect the differential detection accuracy. As shown, the capacitors C are across the gate and source of the current mirror devices improving the noise sensitivity of the reference. The impact to measurement accuracy from any common mode coupling of the surrounding signals to the analog reference may be minimized due to the differential nature of the reference signals.

A differential droop sensing mechanism may be provided within the droop detector unit where the magnitude of the instantaneous differential fluctuations between the monitored Vcc and Vss nodes may be compared to a reference value extracted from a magnitude of the differential input reference current, Iref. This relationship may be governed by the following analytical equation:

$$(vref2-vref1)_{AC} = (Vccmon - Vssmon)_{AC} - 2 \times Iref \times Rref$$

where Vccmon corresponds to the monitored Vcc value, Vssmon corresponds to the monitored Vss value, and such that when Iref is adjusted from the control unit such that (2×Iref×Rref) equals the differential AC supply voltage monitored, the comparator trips. Other relationships are also within the scope of the present invention.

Still further, a detected droop-start or droop-stop, or alternatively an overshoot-start or overshoot-stop event may be asynchronously captured, synchronized, and sent back to the control unit.

Embodiments of the present invention are also applicable to more than two detector units. Additional detector units may be provided with the proper layout area and signal path allocated to each module. One may also determine the frequency domain of the fluctuations of interest and the number of di/dt sources of interest around the die. If, for example, very high frequency (e.g., core clock frequency or higher) fluctuations need to be measured very accurately, a detector module may be provided in close proximity to the source of the di/dt generating circuit to avoid detecting the degraded version of the signal as it propagates through the die rather than the original signal. If measurement of middle/low frequency fluctuations are desired, then one may reduce the number of detectors and cover larger areas on the die with fewer detector modules.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An on-die device comprising:
   a control unit to provide differential reference signals based on a Vcc reference signal and a Vss reference signal;
   a first detector unit to receive said differential reference signals and to provide a first signal based on a monitored Vcc signal and a monitored Vss signal, the first signal indicative of a differential voltage fluctuation at a first component; and
   a droop/overshoot select unit to receive the first signal and select either a voltage droop or a voltage overshoot.

2. The device of claim 1, wherein said control unit comprises a voltage generator to receive the Vcc reference signal and the Vss reference signal from a source external to said die, said voltage generator to provide a control voltage reference signal.

3. The device of claim 1, wherein said control unit comprises a voltage generator to receive the Vcc reference signal and the Vss reference signal from a source internal to said die, said voltage generator to provide a control voltage reference signal.

4. The device of claim 1, wherein said control unit comprises a digital interface to input user inputs and to output signals from said die.

5. The device of claim 1, wherein said differential reference signals comprise differential current signals.

6. The device of claim 1, wherein said first detector unit receives a monitored first signal from said first component on said die and receives a monitored second signal from said first component on said die.

7. The device of claim 6, wherein said first detector unit includes a differential droop sensing mechanism to compare a magnitude of differential fluctuations between said monitored first signal and said monitored second signal with a reference value based on said differential reference signals.

8. The device of claim 7, wherein said differential droop sensing mechanism comprises a comparator to output said first signal indicative of said differential voltage fluctuation based on said comparison.

9. The device of claim 1, further comprising a second detector unit to receive said differential reference signals and to provide a second signal indicative of a differential voltage fluctuation at a second component.

10. An on-die device to determine voltage fluctuations, said device to compare differential reference signals, based on a Vcc reference signal and a Vss reference signal, and monitored voltage signals, based on a monitored Vcc signal and a monitored Vss signal, at a first area of said die, wherein a droop/overshoot select unit receives the monitored voltage signals to select a voltage droop or a voltage overshoot.

11. The device of claim 10, wherein said device comprises:
   a control unit to provide said differential reference signals; and
   a first detector unit to receive said differential reference signals and to provide a first signal indicative of a differential voltage fluctuation at said first area.

12. The device of claim 11, wherein said control unit comprises a voltage generator to receive a first reference voltage signal and a second reference signal from a source external to said die, said voltage generator to provide a control voltage reference signal.

13. The device of claim 11, wherein said control unit comprises a voltage generator to receive a first reference voltage signal and a second reference signal from a source internal to said die, said voltage generator to provide a control voltage reference signal.

14. The device of claim 11, wherein said differential reference signals comprise differential current signals.

15. The device of claim 11, wherein said device further comprises a second detector unit to receive said differential reference signals and to provide a second signal indicative of a differential voltage fluctuation at a second area of said die.

16. A device to monitor voltage fluctuations, said device comprising:
- a control unit to generate reference signals based on a Vcc reference signal and a Vss reference signal;
- a first detector unit to receive said reference signals and to receive first voltage signals from a first device under test, said first detector unit to provide a first signal indicative of voltage fluctuation based on said reference signals and said first voltage signals;
- a second detector unit to receive said reference signals and to receive second voltage signals from a second device under test, said second detector unit to provide a second signal indicative of voltage fluctuation based on said reference signals and said second voltage signals; and
- a droop/overshoot select unit to receive the first signal and select either a voltage droop or a voltage overshoot.

17. The device of claim 16, wherein said device is provided on-die.

18. A silicon die comprising:
- a first component;
- a second component; and
- a device to determine voltage fluctuations at said first component and at said second component said device having a control unit to generate reference signals based on a Vcc reference signal and a Vss reference signal, wherein a droop/overshoot select unit selects either a voltage droop or a voltage overshoot based on the voltage fluctuations.

19. The die of claim 18, wherein said device comprises:
- a first detector unit to receive said reference signals and to receive first voltage signals from said first component, said first detector unit to provide a first signal indicative of voltage fluctuation based on said reference signals and said first voltage signals; and
- a second detector unit to receive second voltage signals from said second component, said second detector unit to provide a second signal indicative of voltage fluctuation based on said reference signals and said second voltage signals.

20. The die of claim 18, wherein said reference signals comprise differential current signals.

21. A method comprising:
- providing differential reference signals on a die based on a Vcc reference signal and a Vss reference signal;
- providing a first signal indicative of a differential voltage fluctuation at a first component on said die based on a monitored Vcc signal and a monitored Vss signal; and
- selecting either a voltage droop or a voltage overshoot by a droop/overshoot select unit based on the first signal.

22. The method of claim 21, wherein said first signal is based at least on said differential reference signals.

23. The method of claim 21, further comprising receiving a monitored first signal from said component and receiving a monitored second signal from said first component.

24. The method of claim 23, wherein providing said signal comprises comparing a magnitude of differential fluctuations between said monitored first signal and said monitored second signal with a reference value based on a magnitude of said differential reference signals.

25. The method of claim 21, wherein said differential reference signals comprise differential current signals.

26. The method of claim 21, further comprising receiving a first reference signal and a second reference signal from a source external to said die.

27. The method of claim 26, further comprising providing a control voltage reference signal based on said first reference signal and said second reference signal, said differential reference signals being based at least on said control voltage reference signal.

28. The method of claim 27, further comprising adjusting said differential reference signals based on a threshold value.

29. The method of claim 21, further comprising receiving a first reference signal and a second reference signal from a source internal to said die.

30. The method of claim 21, further comprising providing a second signal indicative of a differential voltage fluctuation at a second component on said die, wherein said second signal is based at least on said differential reference signals.

* * * * *